United States Patent
Lin et al.

(10) Patent No.: US 7,750,368 B2
(45) Date of Patent: Jul. 6, 2010

(54) MEMORY DEVICE

(75) Inventors: Ta-Wei Lin, Chiayi County (TW); Wen-Jer Tsai, Hualien (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 12/139,418

(22) Filed: Jun. 13, 2008

(65) Prior Publication Data
US 2009/0309158 A1    Dec. 17, 2009

(51) Int. Cl.
*H01L 29/76* (2006.01)
*H01L 29/94* (2006.01)

(52) U.S. Cl. .................. 257/192; 257/289; 257/616; 257/E29.104

(58) Field of Classification Search .............. 257/192, 257/289, 616, E29.104
See application file for complete search history.

(56) References Cited

U.S. PATENT DOCUMENTS

2008/0308802 A1* 12/2008 Honda .................. 257/57
2009/0014817 A1* 1/2009 Shimizu et al. .......... 257/410
2009/0079015 A1* 3/2009 Bhattacharyya .......... 257/410
2009/0184346 A1* 7/2009 Jain ...................... 257/288

* cited by examiner

*Primary Examiner*—Ngan Ngo
(74) *Attorney, Agent, or Firm*—Jianq Chyun IP Office

(57) ABSTRACT

Disclosed is a memory device and method of operation thereof. The memory device may include a source region and a drain region of a first dopant type, the source and drain regions contain a first semiconductor material; a body region of a second dopant type, the body region being sandwiched between the source and drain regions, the body comprising a second semiconductor material; a gate dielectric layer over at least the body region; and a gate comprising a conductive material over the gate dielectric layer. Specifically, one of the first semiconductor material and the second semiconductor material is lattice matched with the other of the first semiconductor material and the second semiconductor material and has an energy gap smaller than the energy gap of the other of the first semiconductor material and the second semiconductor material.

8 Claims, 6 Drawing Sheets

MEMORY DEVICE

BACKGROUND

The present application generally relates to memory cells and, more particularly, to dynamic random access memory (DRAM) cells.

The demand for large-capacity, high-speed and low-power memory devices has been increasing. There are normally two kinds of memory devices, namely, static random access memory (SRAM) and dynamic random access memory (DRAM) devices. Although an SRAM can operate at very high speed, it may occupy a large area on a large-scale integration (LSI) because of its six-transistor (6T)-cell structure. Moreover, it may be difficult for an SRAM cell to be scaled down because of the issue of matching among cell transistors thereof. A DRAM cell, which consists of one transistor and one capacitor (1T/1C), may have a relatively small cell size and a relatively high operation speed. However, a conventional 1T/1C DRAM cell may face a problem in that as the device feature size shrinks, new material such as high dielectric constant film may be needed for a stacked capacitor or a high aspect ratio trench may be required for a trench capacitor combined with a vertical shape access transistor. To circumvent this, several approaches have been used. One of the approaches is the use of a gain cell including a stacked tunnel transistor. Another approach is a magnetic random access memory. However, the former may require a new device structure, and the latter may introduce new material into a metal-oxide-semiconductor (MOS) process, implying that it may take a long time for both to be phased in a productive large-scale memory.

In light of this situation, another kind of memory, called a capacitor-less 1T DRAM or a floating-body cell (FBC), has been provided. This new memory cell uses a floating-body of a partially depleted (PD) silicon-on-insulator (SOI) metal-oxide-semiconductor field effect transistor (MOSFET) as a storage node. Therefore, the 1T DRAM cell may not need a complicated storage capacitor, which means that the 1T DRAM cell may have a good process compatibility with logic devices.

FIG. 1A and FIG. 1B are schematic diagrams illustrating a prior art 1T DRAM cell 10 in different states. The 1T DRAM cell 10 includes a source region 11, a drain region 12, a gate region 13, a cell body 15, and a buried oxide (Box) layer 14, wherein the source region 11, the drain region 12, and the cell body 15 all include silicon. FIG. 1A schematically illustrates the 1T DRAM cell 10 in a logic "1" state while FIG. 1B schematically illustrates the 1T DRAM cell 10 in a logic "0" state. For the 1T DRAM cell 10 according to the prior art, the logic "1" state may be written by means of gate induced drain leakage (GIDL) or impact ionization (II). And the logic "0" state can be done by forward biasing of PN junction, which exists at source to body junction and drain to body junction. Therefore, the 1T DRAM cell 10 may sense whether the majority carriers (holes) accumulate in the floating-body as the threshold voltage (Vth) changes. The source is set to 0 volt, the drain is connected to a bit line, and the gate is connected to a word line. When excess holes exist in the floating-body and Vth lowers, the cell state may be regarded as "1". On the other hand, when excess holes are swept out of the floating-body by a forward bias on the body-drain junction and Vth becomes higher, the cell state may be regarded as "0". The drain current difference between "1" and "0" states can be sensed in the linear current region so as not to change the number of holes by the II current. By performing a read operation in the linear current region, the 1T-DRAM cell achieves the nondestructive read operation during a refresh interval.

The 1T DRAM cell does not need a complicated storage capacitor, which may save the cell size. However, it may be desirable to provide good memory data retention and/or sufficient writing speed for 1T DRAM cells.

BRIEF SUMMARY

Various embodiments may include a memory device. In one embodiment the memory device includes a source region and a drain region of a first dopant type, the source and drain regions contain a first semiconductor material; a body region of a second dopant type, the body region being sandwiched between the source and drain regions, the body comprising a second semiconductor material; a gate dielectric layer over at least the body region; and a gate comprising a conductive material over the gate dielectric layer. Specifically, one of the first semiconductor material and the second semiconductor material is lattice matched with the other of the first semiconductor material and the second semiconductor material and has an energy gap smaller than the energy gap of the other of the first semiconductor material and the second semiconductor material.

One embodiment includes a method of operating a memory device, which may have a body region provided between a source region and a drain region, a gate dielectric layer over the body region, and a gate over the gate dielectric layer. In one embodiment the method may includes applying a drain voltage and a gate voltage to write a first status indication into the memory device; and applying a gate voltage and forward biasing a body-drain or body-source junction to write a second status indication into the memory device.

BRIEF DESCRIPTION OF THE DRAWINGS

The embodiments illustrated in the figures of the accompanying drawings herein are by way of example and not by way of limitation. In the drawings.

DETAILED DESCRIPTION

Reference will now be made in detail to the present examples of the invention illustrated in the accompanying drawings. Wherever possible, the same reference numbers will be used throughout the drawings to refer to the same or like portions. Although an embodiment of the present invention has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

Figure 1A:
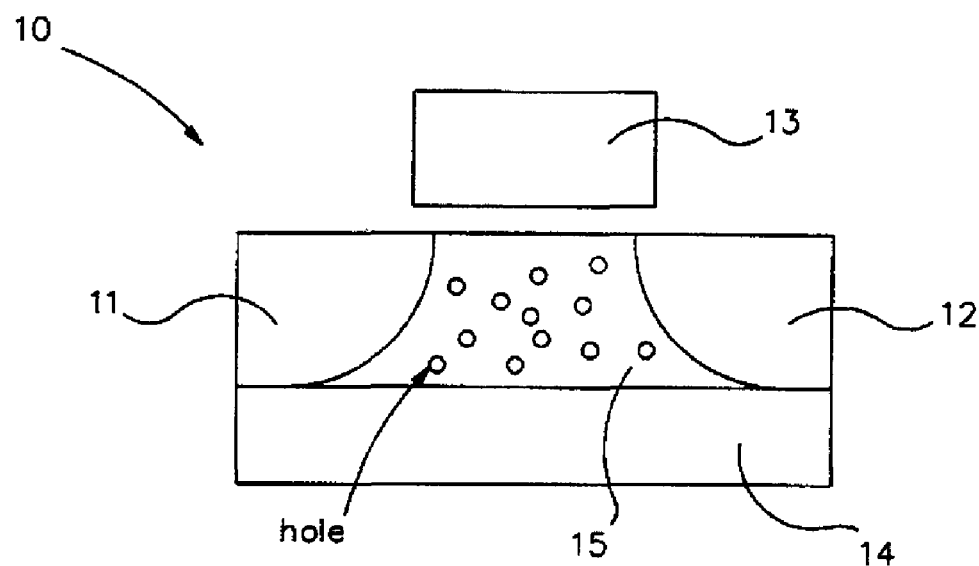
FIG. 1A and FIG. 1B are schematic diagrams illustrating a prior art 1T DRAM cell in different states.
Figure 1B:
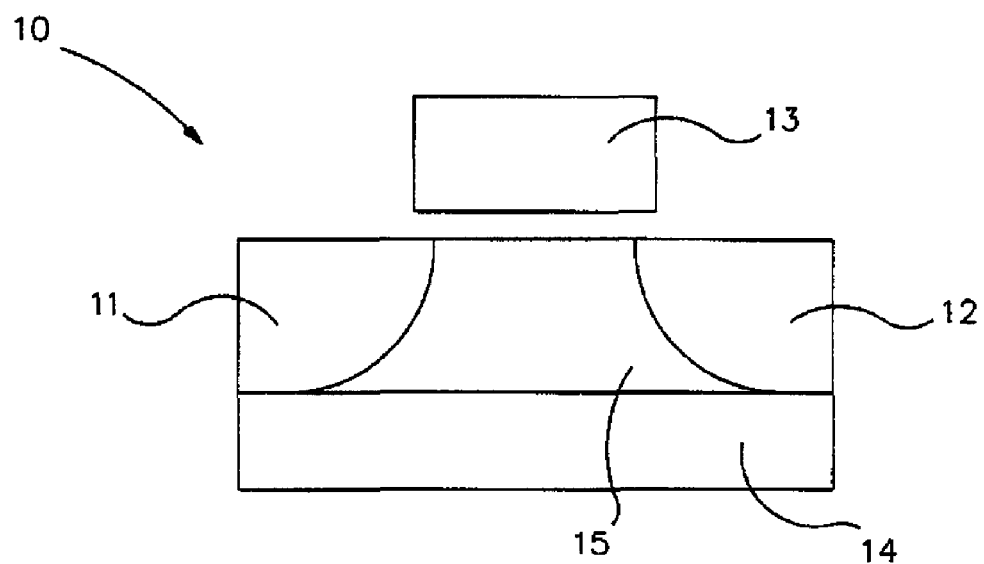
Figure 2A:
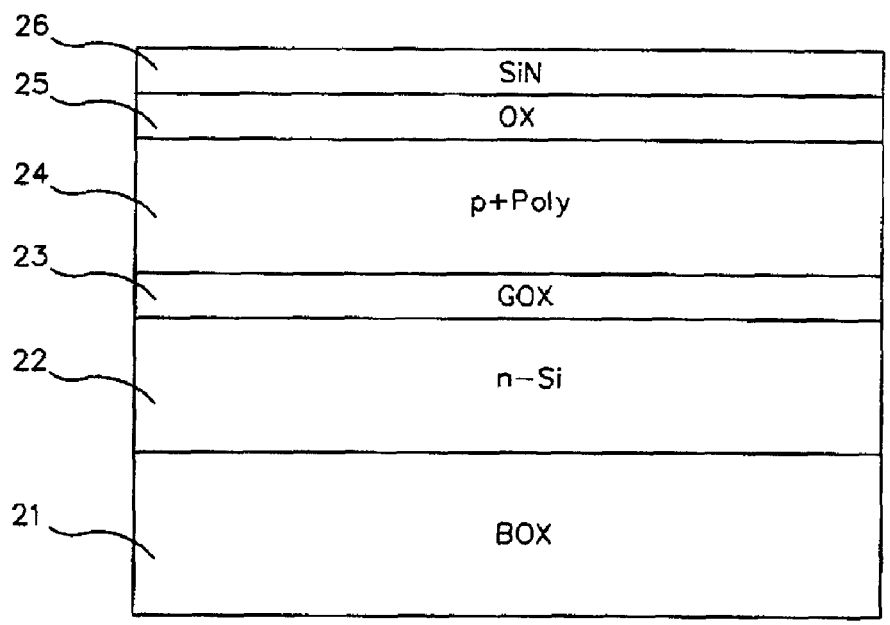
FIGS. 2A to 2F are schematic cross-sectional diagrams illustrating a method for fabricating a 1T PMOS cell according to one embodiment of the present invention.

FIGS. 2A to 2F are schematic cross-sectional diagrams illustrating a method for fabricating a one-transistor (1T) p-type metal oxide semiconductor (PMOS) cell in accordance with one example of the present invention. Referring to FIG. 2A, an insulation layer, such as a buried oxide (BOX) layer 21, may be formed on a substrate (not shown), and an n-type silicon layer 22, a gate oxide layer 23, and a heavily doped p-type (p+) poly-silicon layer 24 may be provided above in sequence. An oxide layer 25 and a silicon nitride (SiN) layer 26, which may serve as a hard mask layer, may be provided above the p+poly-silicon layer 24. In various embodiments other similar materials may be provided to replace silicon nitride used in layer 26.

Figure 2B:
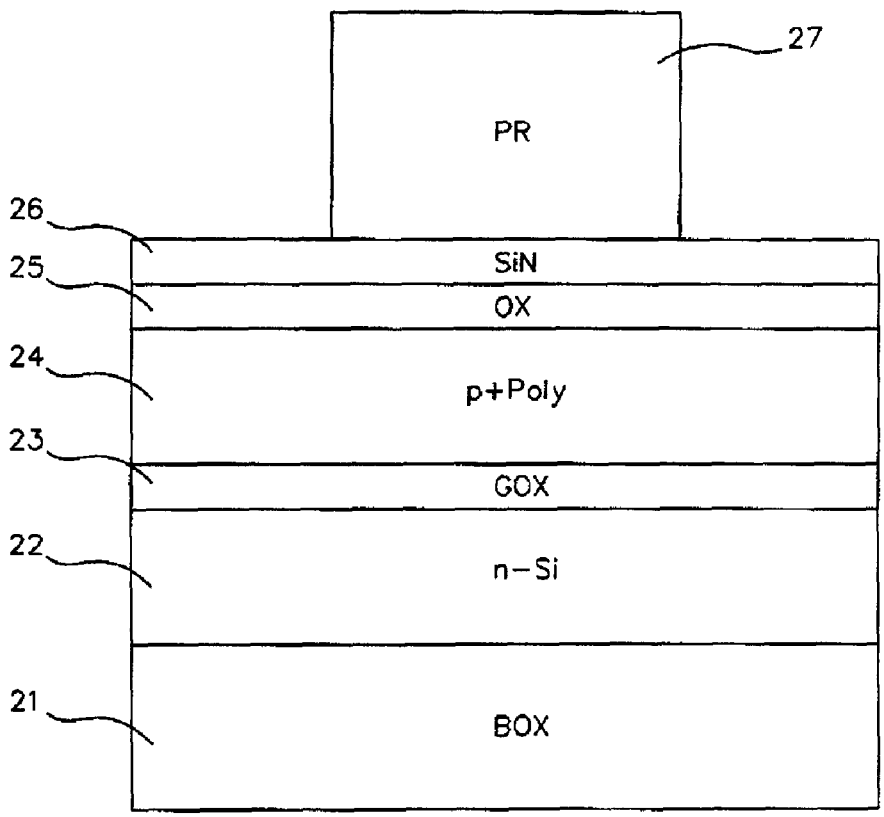
Figure 2C:
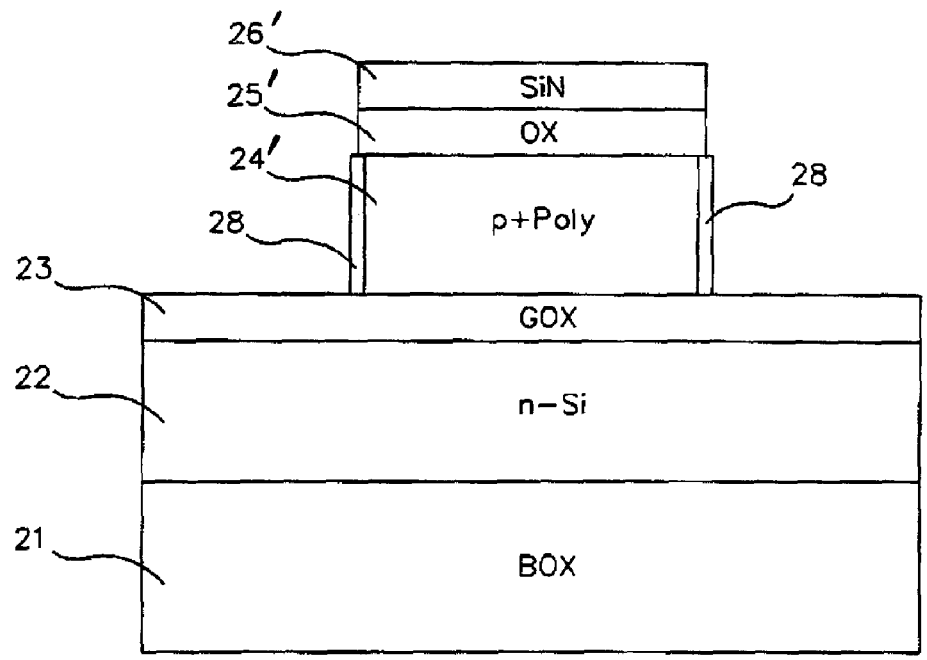
Figure 2D:
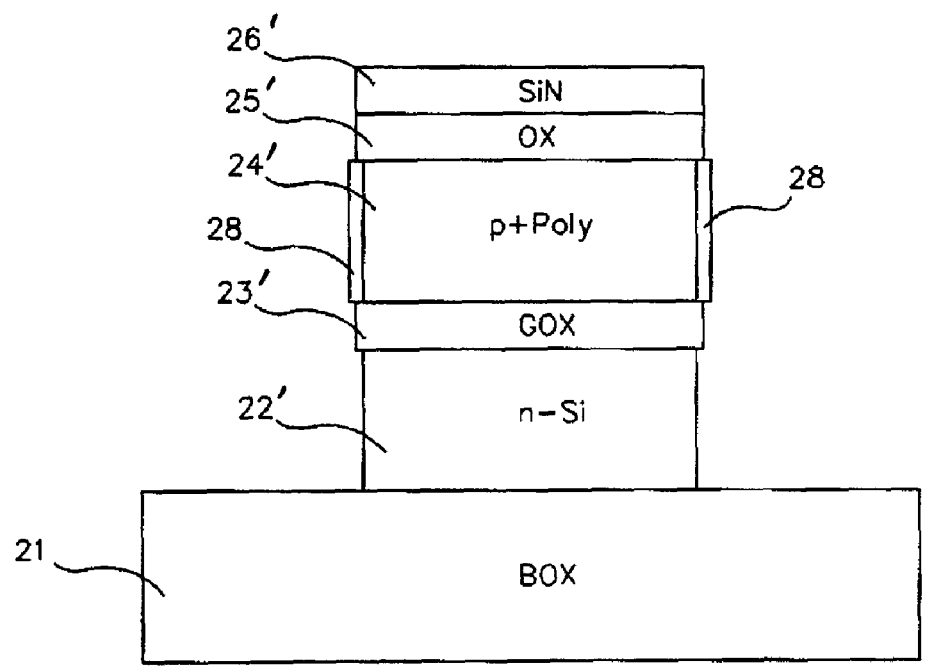

Referring to FIG. 2B, a patterned photoresist (PR) layer 27 may be formed on the SiN layer 26 for patterning the p+ poly silicon layer 24. Referring to FIG. 2C, a patterned SiN layer 26' and a patterned oxide layer 25' may be formed by an etching process or another suitable process, using the patterned PR layer 27 as a mask. The patterned PR layer 27 may then be removed. Next, a patterned p+ poly silicon layer 24' may be formed by etching the p+poly silicon layer 24, using the patterned SiN layer 26' and the patterned oxide layer 25' as a mask. Sidewall spacers 28 may be formed along both sides of the patterned p+ poly silicon layer 24'. The sidewall spacers 28 may include an oxide liner in one example, and may include an oxide liner and a nitride spacer along the oxide liner in another example. Next, referring to FIG. 2D, a patterned gate oxide layer 23' and a patterned n-type silicon layer 22' may be formed by a trench etching process or another suitable process.

Figure 2E:
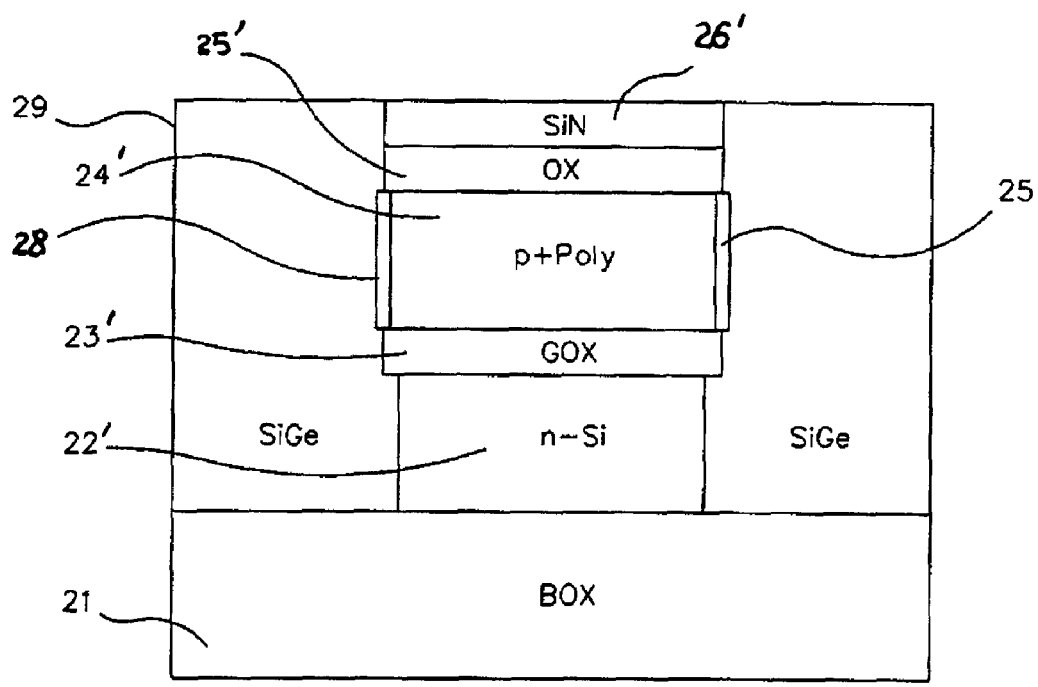
Figure 2F:
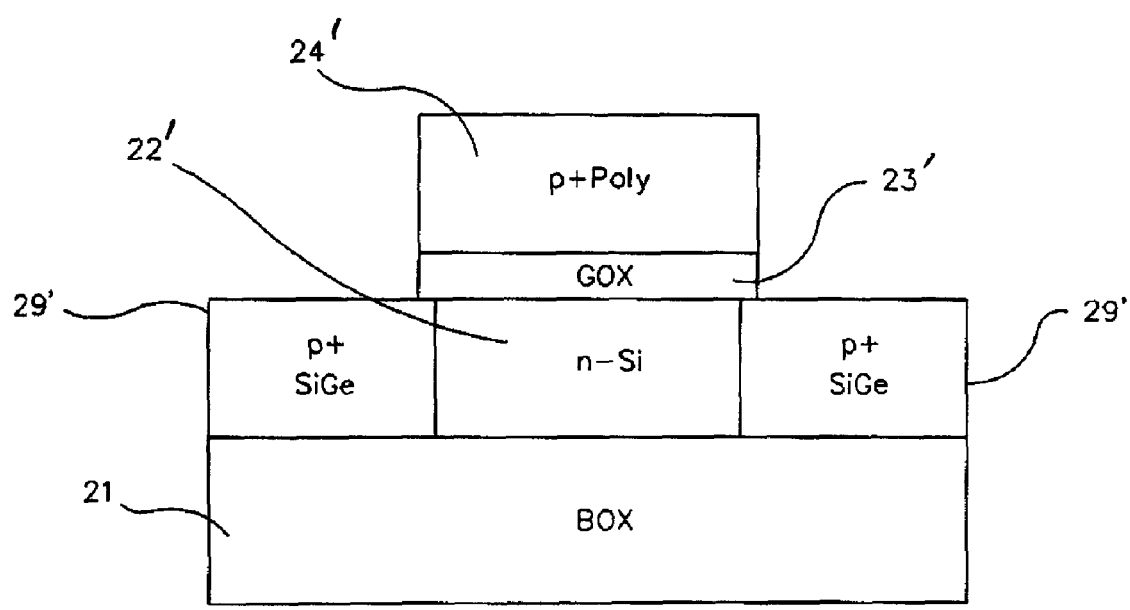

Referring to FIG. 2E, a semiconductor layer 29 may be deposited or epitaxially grown and then planarized. The semiconductor layer 29 may include a semiconductor material, of which a crystal lattice may match that of silicon and an energy gap may be less than that of silicon. In one example, the semiconductor layer 29 may include silicon germanium (SiGe) or crystallized SiGe. Referring to FIG. 2F, the semiconductor layer 29 may be etched back and a p+ implantation process may be conducted to form a pair of p+ diffused regions 29', which may serve as a source region and a drain region, and vice versa, of the PMOS cell. The patterned SiN layer 26' and the patterned oxide layer 25' may then be removed.

Figure 4A:
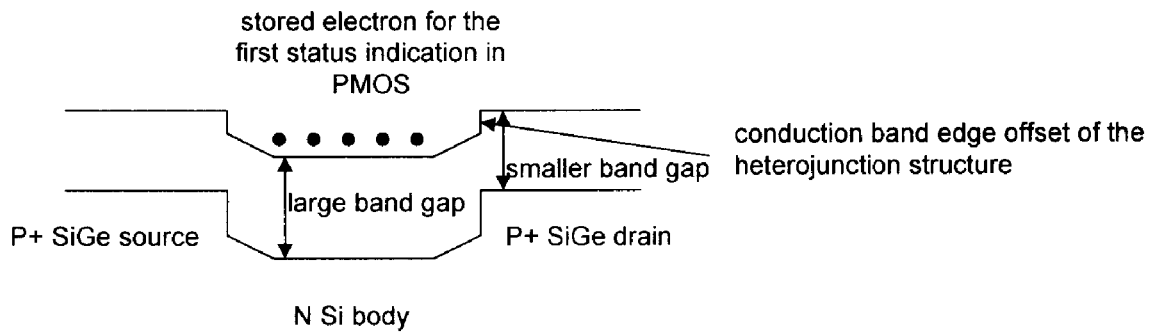
FIG. 4A is a schematic diagram illustrating the band diagram of a PMOS cell in according to one embodiment of the present invention showing the conduction band edge offset between the body and the source/drain regions that improve the data retention.

The utilization of silicon in the cell body and semiconductor SiGe in the drain/source region of the PMOS cell of the present invention provides a smaller band gap between a conduction electron band (Ec) and a valence electron band (Ev) in the source/drain regions as compared to a conventional PMOS cell including a cell body and drain/source regions of silicon. Accordingly, when writing a logic "1" via band-to-band tunneling mechanism, i.e. BTBT, (or gated induced drain leakage, GIDL) originating from the gate-to-drain overlapped p+ region, it may be more efficient to inject electrons to the cell body of the present PMOS cell than that in the prior art under a same bias condition because the band gap is smaller in the p+ drain region. Furthermore, electrons stored in the cell body of the present PMOS cell may be constrained well by the hetero-junction between the source/drain regions and the cell body because the conduction band edge (Ec) is lower in the body region as shown in FIG. 4A. The leakage of electrons to the source region and the drain region may be prevented. Therefore, retention reliability may be improved by such or similar structures.

In other example embodiments, the material such as SiGe or crystallized SiGe in the drain region and the source region of the PMOS cell may be replaced by other semiconductor material of which a crystal lattice matches a crystal lattice of silicon and of which an energy gap is less than an energy gap of silicon and of which the conduction band edge is higher than the conduction band edge of silicon.

Figure 3:
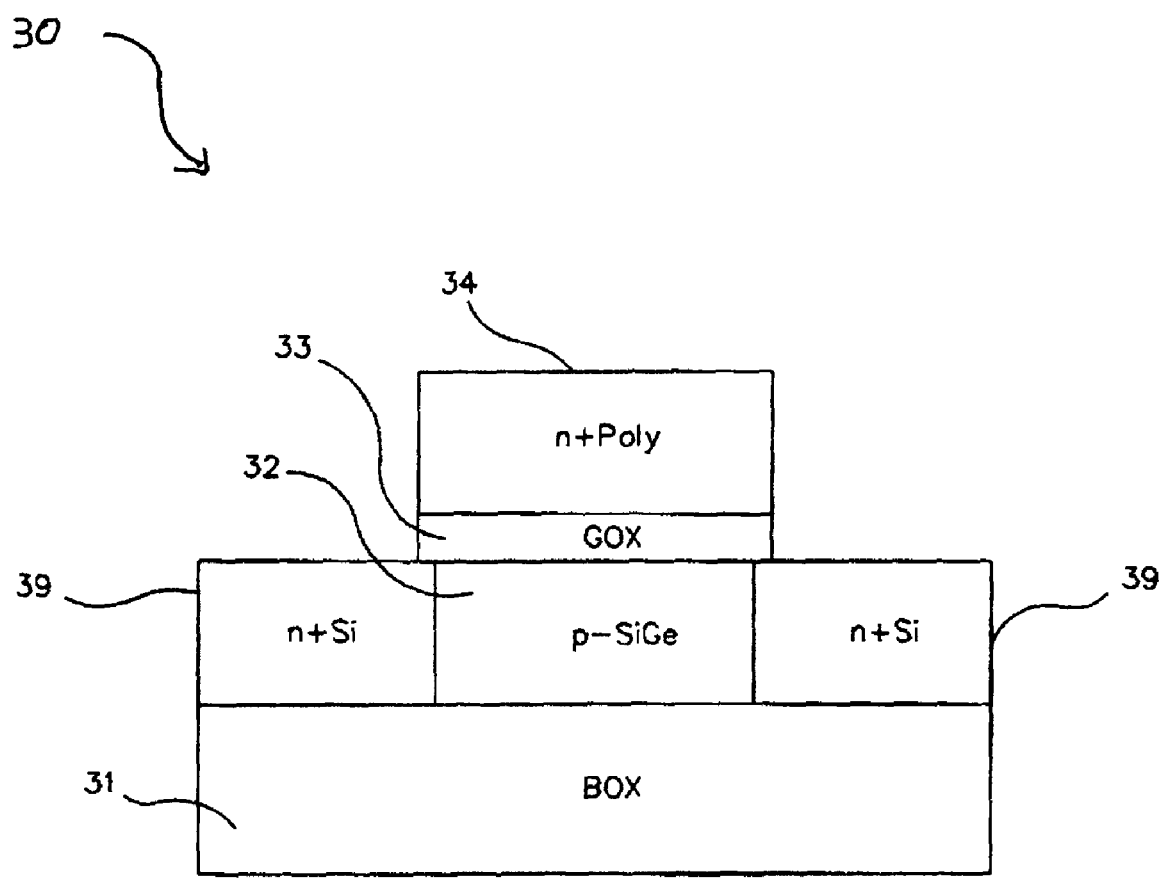
FIG. 3 is a schematic cross-sectional diagram illustrating a 1T NMOS cell according to one embodiment of the present invention.

FIG. 3 is a schematic cross-sectional diagram illustrating a 1T n-type metal oxide semiconductor (NMOS) cell 30 in accordance with one example of the present invention. Referring to FIG. 3, the NMOS cell 30 may include a buried oxide layer 31 on a substrate (not shown), a p-type SiGe layer 32 over the buried oxide layer 31 to serve as a cell body of the NMOS cell 30, heavily doped n-type (n+) silicon regions 39 to serve as a source region and a drain region of the NMOS cell 30, a gate oxide layer 33 over the p-SiGe layer 32, and an n+ poly silicon layer 34 to serve as a gate of the NMOS cell 30. The NMOS cell 30 may be fabricated by a method similar to that in FIGS. 2A to 2F and therefore is not discussed.

Figure 4B:
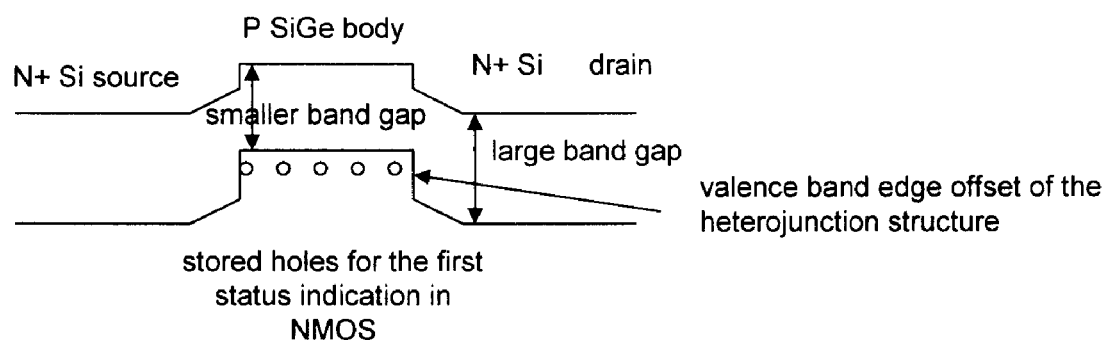
FIG. 4B is a schematic diagram illustrating the band diagram of a NMOS cell in according to one embodiment of the present invention showing the valence band edge offset between the body and the source/drain regions that improve the data retention.

The utilization of silicon in the drain/source region and SiGe in the cell body of the NMOS cell 30 may have the following benefits. When writing a logic "1" via channel current initiated impact ionization, a depletion region in which strong electric field is built may be present in the body near the drain region. Because the band gap is smaller in the body region, it may be more efficient to generate electron-hole pair via impact ionization. The electrons will flow to drain and the holes stay in the cell body 32 of the NMOS cell 30. Furthermore, the holes stored in the cell body 32 of the NMOS cell 30 in a logic "1" state may be constrained by the hetero-junction between the drain/source regions 39 and the cell body 32 of the NMOS cell 30 because the valance band edge is higher in the body region as shown in FIG. 4B. As a result, the leakage of the holes to the source region and the drain region may be prevented. Retention reliability may be improved as a result.

As illustrated above, a method of manufacturing a memory device therefore may include: providing a substrate 21; forming a body region 22 of a first semiconductor material and of a first dopant type over the substrate; forming a source region 29' and a drain region 29' of a second semiconductor material, with the source and drain regions 29' being of a second dopant type and with the body region 22 being sandwiched between the source region 29' and the drain region 29'; forming a gate dielectric layer 23 over the body region 22; and forming a gate 24 over the gate dielectric layer 23. In some examples, the first semiconductor material may include silicon and the second semiconductor material may be lattice matched with silicon and may have an energy gap smaller than an energy gap of silicon. In one example, the second semiconductor material may include silicon-germanium. Alternatively, it may also be the opposite—the second semiconductor material may include silicon and the first semiconductor material may be lattice matched with silicon and may have an energy gap smaller than an energy gap of silicon. In one example, the first semiconductor material may include silicon-germanium. In some examples, the substrate may include a buried oxide layer, such as a semiconductor substrate having a buried oxide layer formed over it.

Therefore, as illustrated in FIG. 2F or FIG. 3, the memory device may include a source region 29' and a drain region 29' of a first dopant type and including or using a first semiconductor material; a body region 22 of a second dopant type, which is sandwiched between the source and drain regions 29' and may include or use a second semiconductor material; a gate dielectric layer 23 over at least the body region 22; and a gate 24 comprising a conductive material over the gate dielectric layer 23. Specifically, one of the first semiconductor material and the second semiconductor material being lattice matched with the other of the first semiconductor material and the second semiconductor material and having an energy gap smaller than an energy gap of the other of the first semiconductor material and the second semiconductor material. In some examples, the material with a smaller band gap would have its conduction band edge higher than the conduction band edge of the material with a large band gap. In some examples, the material with a smaller band gap would have its valence band edge higher than the valence band edge of the material with a large band gap. In some examples, the material with a smaller band gap would have its conduction band edge higher than the conduction band edge of the material with a large band gap, and the material with a smaller band gap would have its valence band edge higher than the valence band edge of the material with a large band gap. In some examples, the material with a smaller band gap would be of p-type doping.

In one example, the first semiconductor material may be Si and the second semiconductor material may be silicon-germanium. Alternatively, the first semiconductor material may be silicon-germanium and the second semiconductor material may be silicon. There may be various combinations of the first and second semiconductor material. In some examples, the semiconductor material having a smaller energy gap may have P-type dopants and the semiconductor material having a larger energy gap may have N-type dopants. In some examples, the semiconductor material having a larger energy gap may have its conduction band edge lower than the conduction band edge of the semiconductor material having a smaller energy gap. In some other examples, the semiconductor material having a larger energy gap may have its valence band edge lower than the valence band edge of the semiconductor material having a smaller energy gap.

The first dopant type may be one of a P type and an N type and the second dopant type may be the other of the P and N types. In some examples, the P type doped regions is of SiGe. The memory device may include a buried oxide layer 21 (BOX) under the drain region 29', the source region 29', and the body region 22. In one example, the gate dielectric or gate oxide (GOX) layer 23 may include silicon oxide (SiOx).

In operating a memory device, different methods of operation may be used depending on the materials of the source 29', drain 29', and body regions 22. In general, the memory device may have a structure as illustrated above, such as having a body region 22 provided between a source region 29' and a drain region 29', a gate dielectric layer 23 over the body region 22, and a gate 24 over the gate dielectric layer 23. In one example, the method may include applying a drain voltage and a gate voltage to write a first status indication into the memory device; and applying a gate voltage and forward biasing a body-drain junction or source-drain junction to write a second status indication into the memory device. Specifically, imposing a drain voltage and gate voltage to write the first status indication may result in channel current initiated impact ionization to inject holes to the body region in the case of a NMOS device or result in band-to-band tunneling to inject electrons to the body region in the case of a PMOS device. In some examples, the first status indication stored in the body region is constrained by hetero-junction of the body-drain junction and the body-source junction. The method may be suitable for PMOS and NMOS memory devices that have source/drain regions and a body region, respectively, using or including doped SiGe, such as P—SiGe source/drain in PMOS or P—SiGe body in NMOS.

In describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

We claim:

1. A memory device, comprising:
    a source region and a drain region of a first dopant type, the source and drain regions comprising a first semiconductor material;
    a body region of a second dopant type, the body region being sandwiched between the source and drain regions, the body comprising a second semiconductor material;
    a gate dielectric layer over at least the body region; and
    a gate comprising a conductive material over the gate dielectric layer,
    wherein one of the first semiconductor material and the second semiconductor material being lattice matched with the other of the first semiconductor material and the second semiconductor material and having an energy gap smaller than an energy gap of the other of the first semiconductor material and the second semiconductor material.

2. The memory device of claim 1, wherein the first semiconductor material comprises one of silicon-germanium and Si and the second semiconductor material comprises the other of silicon-germanium and Si.

3. The memory device of claim 2, wherein the first dopant type is one of a P type and an N type and the second dopant type is the other of the P and N types.

4. The memory device of claim 1, wherein the semiconductor material having a smaller energy gap comprises P-type dopants and the semiconductor material having a larger energy gap comprises N-type dopants.

5. The memory device of claim 1, wherein the semiconductor material having a larger energy gap has its conduction band edge lower than the conduction band edge of the semiconductor material having a smaller energy gap.

6. The memory device of claim 1, wherein the semiconductor material having a larger energy gap has its valence band edge lower than the valence band edge of the semiconductor material having a smaller energy gap.

7. The memory device of claim 1 further comprising a buried oxide layer under the drain region, the source region, and the body region.

8. The memory device of claim 1, wherein the gate dielectric layer comprises silicon oxide.

* * * * *